(12) United States Patent
Harker et al.

(10) Patent No.: US 9,502,206 B2
(45) Date of Patent: Nov. 22, 2016

(54) CORROSION-RESISTANT, STRONG X-RAY WINDOW

(71) Applicants: Brigham Young University, Provo, UT (US); Moxtek, Inc., Orem, UT (US)

(72) Inventors: Mallorie Harker, Springville, UT (US); Steven D. Liddiard, Springville, UT (US); Jonathan Abbott, Saratoga Springs, UT (US); Robert Davis, Provo, UT (US); Richard Vanfleet, Provo, UT (US); Lei Pei, Provo, UT (US)

(73) Assignees: Brigham Young University, Provo, UT (US); Moxtek, Inc., Orem, UT (US)

( * ) Notice: Subject to any disclaimer, the term of this patent is extended or adjusted under 35 U.S.C. 154(b) by 217 days.

(21) Appl. No.: 14/597,955

(22) Filed: Jan. 15, 2015

(65) Prior Publication Data

US 2015/0303024 A1 Oct. 22, 2015

Related U.S. Application Data

(63) Continuation-in-part of application No. 13/855,580, filed on Apr. 2, 2013, now abandoned.

(60) Provisional application No. 61/663,173, filed on Jun. 22, 2012, provisional application No. 61/655,764, filed on Jun. 5, 2012.

(51) Int. Cl.
*H01J 35/18* (2006.01)
*G21K 1/00* (2006.01)
*H04R 1/00* (2006.01)
*B81B 3/00* (2006.01)
*H01J 5/18* (2006.01)
(Continued)

(52) U.S. Cl.
CPC ............. *H01J 35/18* (2013.01); *B81B 3/0078* (2013.01); *G21K 1/00* (2013.01); *H01J 5/18* (2013.01); *H04R 1/00* (2013.01); *H01J 2235/183* (2013.01); *H04R 7/10* (2013.01); *H04R 19/005* (2013.01); *H04R 19/04* (2013.01); *H04R 31/00* (2013.01)

(58) Field of Classification Search
None
See application file for complete search history.

(56) References Cited

U.S. PATENT DOCUMENTS

| 4,837,068 A | 6/1989 | Martin et al. |
| 5,055,421 A | 10/1991 | Birkle et al. |

(Continued)

FOREIGN PATENT DOCUMENTS

| EP | 0 400 655 A1 | 12/1990 |
| JP | S6074253 | 4/1985 |

(Continued)

OTHER PUBLICATIONS

Goswami et al.; "Transparent polymer and diamond-like hydrogenated amorphous carbon thin films by PECVD technique;" Journal of Physics D. Applied Physics (2008), vol. 4; 7 pages.

(Continued)

*Primary Examiner* — David Sample
*Assistant Examiner* — Donald M Flores, Jr.

(57) ABSTRACT

The invention is an x-ray window with a stack of thin film layers including aluminum layer(s), corrosion-barrier layer(s), and/or polymer layer(s). Aluminum layer(s) can provide improved gas impermeability. Polymer layer(s) can increase structural strength. The x-ray window can be substantially transmissive to x-rays but also substantially block visible light and infrared light. The x-ray window can have minimal deflection.

20 Claims, 3 Drawing Sheets

(51) Int. Cl.
   *H04R 7/10*      (2006.01)
   *H04R 19/00*     (2006.01)
   *H04R 31/00*     (2006.01)
   *H04R 19/04*     (2006.01)

(56) References Cited

U.S. PATENT DOCUMENTS

| | | |
|---|---|---|
| 5,090,046 A | 2/1992 | Friel |
| 5,206,534 A | 4/1993 | Birkle et al. |
| 5,465,023 A | 11/1995 | Garner |
| 5,561,342 A | 10/1996 | Roeder et al. |
| 5,616,179 A | 4/1997 | Baldwin et al. |
| 6,567,500 B2 | 5/2003 | Rother |
| 6,738,484 B2 | 5/2004 | Nakabayashi |
| 7,166,910 B2 | 1/2007 | Minervini |
| 7,378,157 B2 | 5/2008 | Sakakura et al. |
| 7,428,054 B2 | 9/2008 | Yu et al. |
| 7,756,251 B2 | 7/2010 | Davis et al. |
| 2005/0157305 A1 | 7/2005 | Yu et al. |
| 2011/0031566 A1 | 2/2011 | Kim et al. |
| 2011/0089330 A1 | 4/2011 | Thoms |
| 2012/0003448 A1* | 1/2012 | Weigel .............. B32B 17/10018 428/212 |

FOREIGN PATENT DOCUMENTS

| | | |
|---|---|---|
| JP | S6089054 | 5/1985 |
| JP | 2001-179844 | 7/2001 |
| WO | WO 2009/085351 A2 | 7/2009 |

OTHER PUBLICATIONS

PCT application EP12167551.6; Filing date May 10, 2012; Robert C. Davis; European Search Report mailed Nov. 28, 2013.

Savvides et al.; "Diamondlike amorphous carbon films prepared by magnetron sputtering of graphite;" J. Vac. Sci. Technol. A 3 (6), Nov./Dec. 1995.

* cited by examiner

US 9,502,206 B2

CORROSION-RESISTANT, STRONG X-RAY WINDOW

CLAIM OF PRIORITY

This is a continuation-in-part of U.S. patent application Ser. No. 13/855,580, filed on Apr. 2, 2013, which claims priority to U.S. Provisional Patent Application Ser. Nos. 61/663,173, filed on Jun. 22, 2012, and 61/655,764, filed on Jun. 5, 2012, which are hereby incorporated herein by reference in their entirety.

FIELD OF THE INVENTION

The present application is related generally to x-ray windows.

BACKGROUND

X-ray windows can be used for enclosing an x-ray source or an x-ray detector. In order to expose the x-ray detector to x-rays coming from multiple angles, it can be important to dispose the x-ray detector close to the x-ray window. The x-ray detector is typically disposed in an evacuated enclosure. The window can be used to separate ambient air from a vacuum within the enclosure.

X-ray windows can be made of a thin film. It can be desirable to minimize attenuation of the x-rays (especially with low energy x-rays), thus it can be desirable that the film is made of a material and thickness that will result in minimal attenuation of the x-rays. Thinner films attenuate x-rays less than thick films. The film cannot be too thin; however, or the film may sag or break.

A broken film can allow air to enter the enclosure, often destroying the functionality of the device. A sagging film can result in cracking of corrosion resistant coatings or allow the x-ray window to touch the x-ray detector. Thus it can be desirable to have a film that is made of a material that will have sufficient strength to avoid breaking or sagging, but also as thin as possible for minimizing attenuation of x-rays.

If the x-ray window is used with an x-ray detector, in order to avoid contamination of an x-ray spectra from a sample being measured, it can be desirable that x-rays impinging on the x-ray detector are only emitted from the source to be measured. Unfortunately, x-ray windows can also fluoresce and thus emit x-rays that can cause contamination lines in the x-ray spectra. Contamination of the x-ray spectra caused by low atomic number elements is usually less problematic than contamination caused by higher atomic number elements. It can be desirable therefore that the window and support structure be made of materials with as low of an atomic number as possible in order to minimize this noise.

It can also be important for x-ray windows to block visible and infrared light transmission, in order to avoid creating undesirable noise in sensitive instruments, such as an x-ray detector for example.

Information relevant to attempts to address these problems can be found in U.S. Pat. No. 5,090,046.

SUMMARY

It has been recognized that it would be advantageous to have an x-ray window that is strong, minimizes attenuation of x-rays, minimizes x-ray spectra contamination, minimizes visible light transmission, and minimizes infrared light transmission. The present invention is directed to various embodiments of x-ray windows that satisfy these needs. Each embodiment may satisfy one, some, or all of these needs.

In one embodiment, the x-ray window includes a stack of thin film layers including an aluminum layer, a polymer layer, and a corrosion-barrier layer. In another embodiment, the x-ray window includes an aluminum layer disposed between two corrosion-barrier layers.

DEFINITIONS

As used herein, the term amorphous carbon means an allotrope of carbon that lacks crystalline structure and includes both sp3 (tetrahedral or diamond-like) bonds and sp2 (trigonal or graphitic) bonds.

Hydrogenated amorphous carbon means an amorphous carbon in which some of the carbon atoms are bonded to hydrogen atoms.

DETAILED DESCRIPTION

Figure 1:
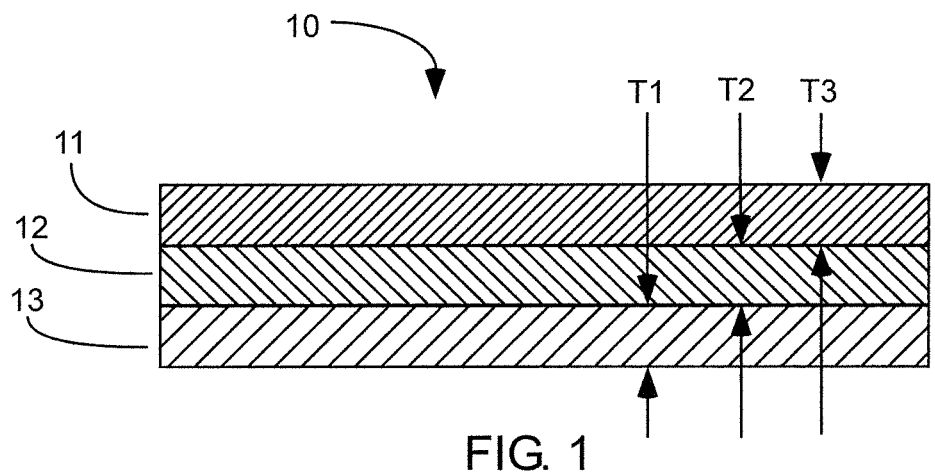
FIG. 1 is a schematic cross-sectional side view of an x-ray window including three layers of material, in accordance with an embodiment of the present invention.

As illustrated in FIG. 1, an x-ray window 10 is shown comprising a stack of at least three layers 11-13 of material. The layers 11-13 can include at least one aluminum layer, at least one corrosion-barrier layer, and/or at least one polymer layer. The layers can each have a thickness T1-3.

Use of polymer layer(s) can be beneficial for providing structural strength to the window. Aluminum layer(s) can provide improved gas impermeability to the window. Corrosion-barrier layer(s) can provide corrosion resistance.

These materials have fairly low atomic numbers, thus minimizing x-ray spectra contamination.

The aluminum layer(s) can be substantially pure aluminum, or can include other elements. For example, a mass percent of aluminum in the aluminum layer(s) can be at least 80% in one embodiment, at least 95% in another embodiment, or at least 99% in another embodiment. In the various embodiments described herein, the aluminum layer(s) can have various thicknesses. For example, the aluminum layer(s) can have a thickness of between 10 to 30 nanometers in one embodiment, or a thickness of between 10 to 60 nanometers in another embodiment.

The corrosion-barrier layers can include HMDS (hexamethyldisilazane). HMDS is an organosilicon compound with the molecular formula $[(CH_3)_3Si]_2NH$. The corrosion-barrier layers can include a very high mass percent of HMDS, such as for example at least 80% in one embodiment, at least 95% in another embodiment, or at least 99% in another embodiment.

The corrosion-barrier layers can also or alternatively include only carbon, or substantially only carbon, and can be amorphous carbon in one embodiment. The amorphous carbon can have various percentages of carbon, such as for example a mass percent of carbon in the amorphous carbon can be at least 80% in one embodiment, at least 95% in another embodiment, or at least 99% in another embodiment.

Hybridization of carbon in the amorphous carbon can include both sp3 hybridization and sp2 hybridization in various relative percentages. For example, the percent sp3 hybridization can be between 5% and 25% in one embodiment, between 15% and 25% in another embodiment, between 5% and 15% in another embodiment, or less than 25% in another embodiment. The percent sp2 hybridization can be between 75% and 95% in one embodiment, between 85% and 95% in another embodiment, between 85% and 95% in another embodiment, or greater than 75% in another embodiment.

The amorphous carbon can be hydrogenated amorphous carbon. Hydrogen inside the amorphous carbon matrix can help to stabilize the sp3 carbon atoms and can improve the cohesiveness of the layer. There can be many different percentages of atomic percent of hydrogen in the hydrogenated amorphous carbon. For example, an atomic percent of hydrogen in the hydrogenated amorphous carbon can be between 50% and 70% in one embodiment, between 25% and 51% in another embodiment, between 14% and 26% in another embodiment, between 5% and 15% in another embodiment, between 1% and 10% in another embodiment, or between 0.1% and 2% in another embodiment.

The corrosion-barrier layers can have various thicknesses. For example, the corrosion-barrier layer(s) can have a thickness of between 5 to 25 nanometers in one embodiment or a thickness of between 1 to 25 nanometers in another embodiment.

The polymer layer(s) can have various mass percentages of polymer. For example, a mass percent of polymer in the polymer layer(s) can be at least 80% in one embodiment, at least 95% in another embodiment, or at least 99% in another embodiment. The term "mass percent of polymer" means percent by mass in the layer that are elements of the polymer selected, such as carbon and hydrogen, and possibly other elements, depending on the polymer selected. The polymer layer can consist of substantially only polymer in one embodiment, or can include other elements or molecules in another embodiment.

The polymer layer(s) can have various thicknesses. For example, and the polymer layer can have a thickness of between 150 to 400 nanometers.

The polymer can be or can include a polyimide. Polyimide can be useful due to its high strength and high temperature resistance as compared with many other polymers.

Thin films of aluminum can have defects in grain structure where gas molecules can diffuse through. To make the thin film of aluminum leak-tight, thickness of the aluminum thin film can be increased. Increasing thickness of an aluminum layer in an x-ray window, however, is undesirable due to increased x-ray spectra contamination and increased x-ray attenuation due to the thicker aluminum layer. Overall aluminum thickness can be reduced and still maintain a specified leak-rate by use of dual aluminum layers (see for example 21a-b in FIG. 2). The reason is that a defect in one aluminum layer likely will not be aligned with a defect in the other aluminum layer, thus making it more difficult for a gas molecule to pass through. Use of a layer of another material between the aluminum layers can further increase the path distance a gas molecule must travel to escape, and thus further avoid gas leakage.

Figure 2:
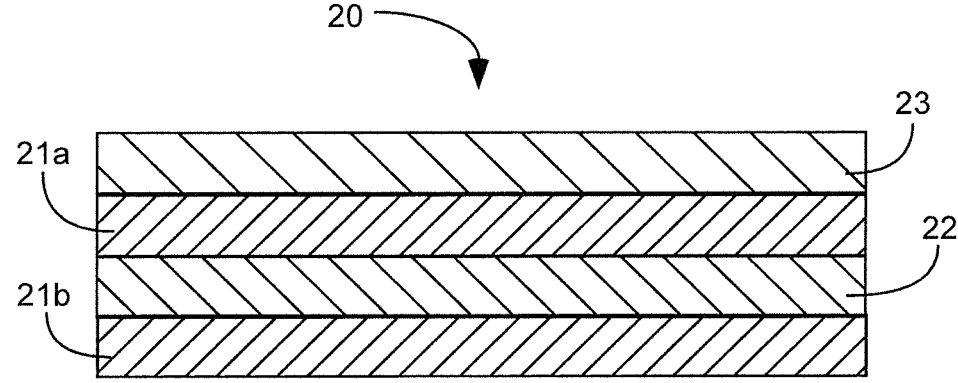
FIG. 2 is a schematic cross-sectional side view of an x-ray window including a corrosion-barrier layer 23, two aluminum layers 21*a-b*, and a polymer layer 22, in accordance with an embodiment of the present invention.

For example, as illustrated in FIG. 2, an x-ray window 20 is shown comprising a stack of thin film layers including a first aluminum layer 21a, a second aluminum layer 21b, a polymer layer 22, and a corrosion-barrier layer 23. In FIG. 2, an order of the stack of thin film layers is the corrosion-barrier layer 23, the first aluminum layer 21a, the polymer layer 22, then the second aluminum layer 21b. In other words, the first aluminum layer 21a and the polymer layer 22 are disposed between the corrosion-barrier layer 23 and the second aluminum layer 21b and the polymer layer 22 is disposed between the two aluminum layers 21a-b. The polymer layer 22 can provide structural support. The two aluminum layers 21a-b, which sandwich the polymer layer 22, can help provide gas impermeability. The corrosion-barrier layer 23 can provide corrosion protection to the first aluminum layer 21a.

Figure 3:
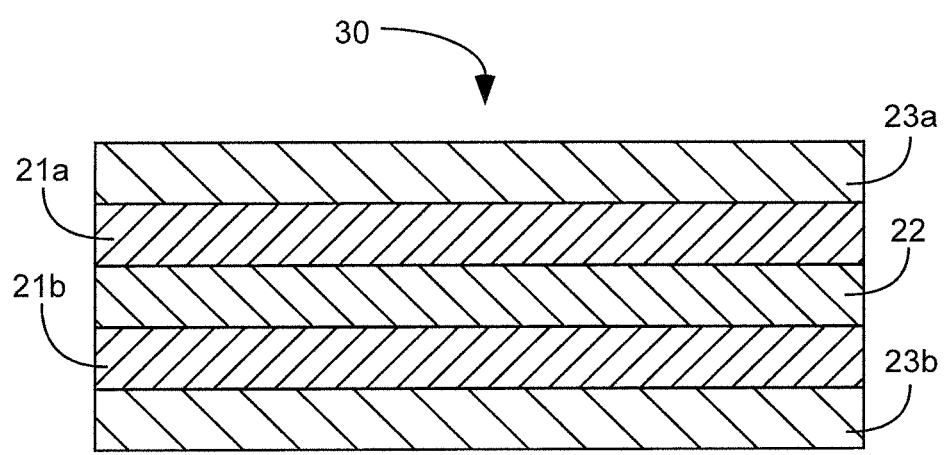
FIG. 3 is a schematic cross-sectional side view of an x-ray window including two corrosion-barrier layers 23*a-b*, two aluminum layers 21*a-b*, and a polymer layer 22, in accordance with an embodiment of the present invention.

As illustrated in FIG. 3, an x-ray window 30 is shown comprising a stack of thin film layers including a first aluminum layer 21a, a second aluminum layer 21b, a polymer layer 22, a first corrosion-barrier layer 23a, and a second corrosion-barrier layer 23b. An order of the stack of thin film layers shown in FIG. 3 is the first corrosion-barrier layer 23a, the first aluminum layer 21a, the polymer layer 22, the second aluminum layer 21b, then the second corrosion-barrier layer 23b. In other words, the polymer layer 22 is disposed between the two aluminum layers 21a-b. The polymer layer 22 and the two aluminum layers 21a-b are disposed between two corrosion-barrier layers 23a-b. The polymer layer can 22 provide structural support. The two aluminum layers 21a-b, which sandwich the polymer layer 22, can help provide gas impermeability. The corrosion-barrier layers 23a-b can provide corrosion protection to the aluminum layers 21a-b. Selection of the x-ray window 20 of FIG. 2 or the x-ray window 30 of FIG. 3 may be made based on whether there is a need for corrosion protection of both aluminum layers 21a-b, manufacturability, cost considerations, and the amount of x-ray attenuation caused by the second corrosion-barrier layer 23b.

Figure 4:
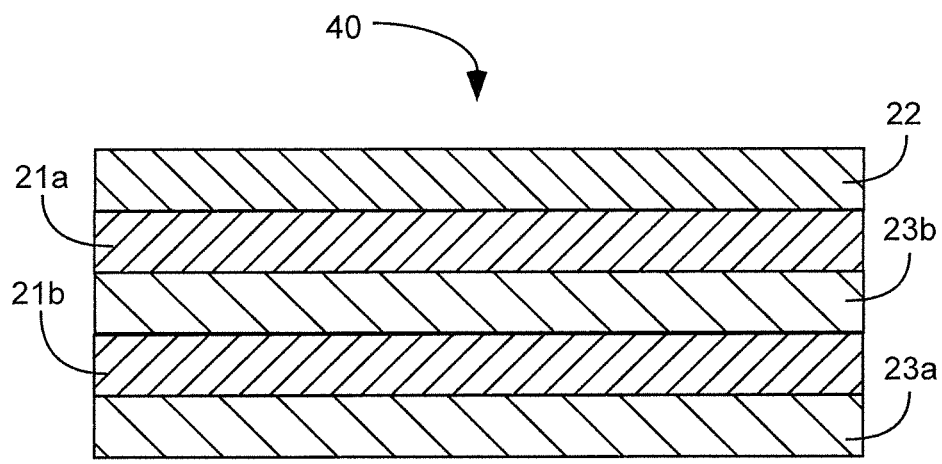
FIG. 4 is a schematic cross-sectional side view of an x-ray window including two corrosion-barrier layers 23*a-b*, two aluminum layers 21*a-b*, and a polymer layer 22, in accordance with an embodiment of the present invention.

As illustrated in FIG. 4, an x-ray window 40 is shown comprising a stack of thin film layers including a first aluminum layer 21a, a second aluminum layer 21b, a polymer layer 22, a first corrosion-barrier layer 23a, and a second corrosion-barrier layer 23b. An order of the stack of thin film layers is the polymer layer 22, the first aluminum layer 21a, the second corrosion-barrier layer 23b, the second aluminum layer 21*b*, then first corrosion-barrier layer 23*a*. In other words, the second corrosion-barrier layer 23*b* is disposed between the two aluminum layers 21*a-b*. The second corrosion-barrier layer 23*b* and the two aluminum layers 21*a-b* are disposed between the polymer layer 22 and the first corrosion-barrier layer 23*a*. The polymer layer can 22 provide structural support. The two aluminum layers 21*a-b* can help provide gas impermeability. The corrosion-barrier layers 23*a-b* can provide corrosion protection.

Figure 5:
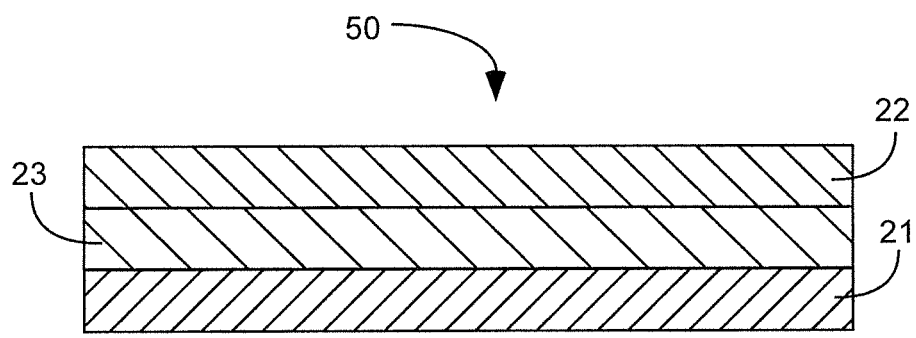
FIG. 5 is a schematic cross-sectional side view of an x-ray window including a corrosion-barrier layer 23 disposed between a polymer layer 22 and an aluminum layer 21, in accordance with an embodiment of the present invention.

As illustrated in FIG. 5, an x-ray window 50 is shown comprising a stack of thin film layers including an aluminum layer 21, a polymer layer 22, and a corrosion-barrier layer 23. An order of the stack of thin film layers is the polymer layer 22, the first corrosion-barrier layer 23, then the aluminum layer 21. In other words, the corrosion-barrier layer 23 is disposed between the polymer layer 22 and the aluminum layer 21. This embodiment can be useful due to a small number of layers, thus minimizing x-ray attenuation, allowing ease of manufacturing, and reducing cost. The aluminum layer can be protected from corrosion if the aluminum layer is disposed to face a protected environment, such as the vacuum portion of the device for example, and the polymer layer disposed towards a more corrosive environment, such as the ambient air.

Figure 6:
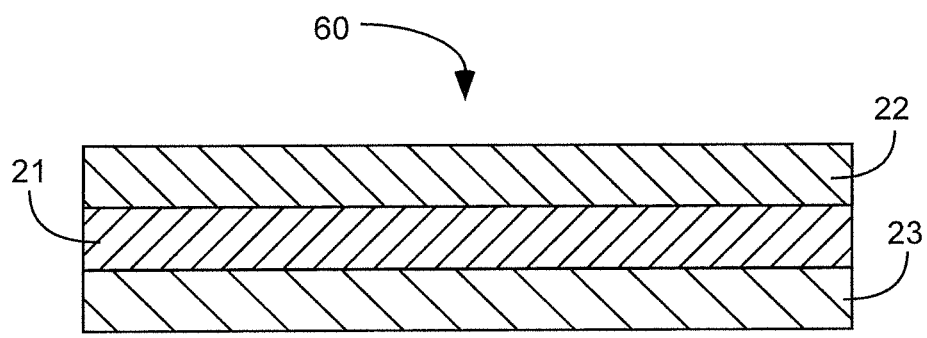
FIG. 6 is a schematic cross-sectional side view of an x-ray window including an aluminum layer 21 disposed between a polymer layer 22 and a corrosion-barrier layer 23, in accordance with an embodiment of the present invention.

As illustrated in FIG. 6, an x-ray window 60 is shown comprising a stack of thin film layers including an aluminum layer 21, a polymer layer 22, and an corrosion-barrier layer 23. An order of the stack of thin film layers is the polymer layer 22, the aluminum layer 21, then the corrosion-barrier layer 23. In other words, the aluminum layer 21 is disposed between the polymer layer 22 and the corrosion-barrier layer 23. This embodiment can be useful due to a small number of layers, which can minimize x-ray attenuation, reduce cost, and allow ease of manufacturing. The aluminum layer 21 can improve gas impermeability of the polymer layer 22 and the corrosion-barrier layer can provide corrosion protection to the aluminum layer 21.

Figure 7:
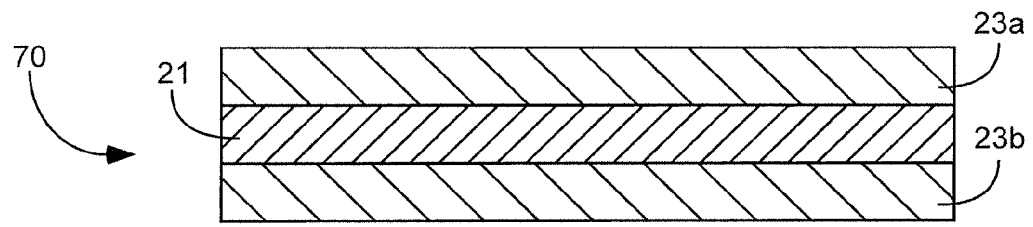
FIG. 7 is a schematic cross-sectional side view of an x-ray window including an aluminum layer 21 disposed between two corrosion-barrier layers 23*a-b*, in accordance with an embodiment of the present invention.

As illustrated in FIG. 7, an x-ray window 70 is shown comprising a stack of thin film layers including an aluminum layer 21, a first corrosion-barrier layer 23*a*, and a second corrosion-barrier layer 23*b*. An order of the stack of thin film layers is the first corrosion-barrier layer 23*a*, the aluminum layer 21, then the second corrosion-barrier layer 23*b*. In other words, the aluminum layer 21 is disposed between the two corrosion-barrier layers 23*a-b*. This embodiment can be useful due to a small number of layers, which can minimize x-ray attenuation, allow ease of manufacturing, and reduce cost. The aluminum layer can improve strength and gas impermeability. The corrosion-barrier layers 23*a-b* can provide corrosion protection to the aluminum layer 21. This embodiment may be useful if the polymer layer is not needed for added strength, such as for example if the x-ray window does not need to span a large distance or another material is used to strengthen the aluminum layer 21 and the two corrosion-barrier layers 23*a-b*.

Figure 8:
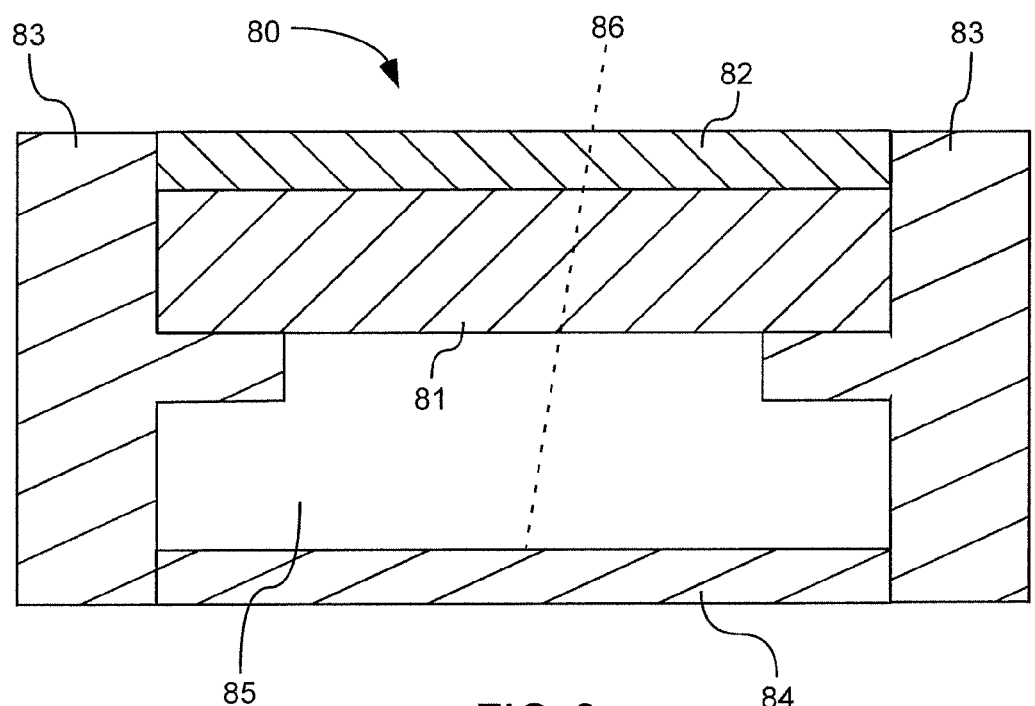
FIG. 8 is a schematic cross-sectional side view of an x-ray window 80 hermetically sealed to an opening of an enclosure 83 having a hollow center, in accordance with an embodiment of the present invention.

As illustrated in FIG. 8, an x-ray window comprising a stack of thin film layers 80, according to one of the embodiments described herein, can be hermetically sealed to an opening of an enclosure 83. The enclosure 83 can include a hollow center 85. The stack of thin film layers 80 can include inner layer 81 and an outer layer 82. The inner layer 81 can include one layer or at least two layers of different materials. The outer layer 82 can be disposed as the farthest layer away from the hollow center 85. The outer layer 82 can be a corrosion-barrier layer 23. Use of a corrosion-barrier layer 23 as the outer layer 82 provide corrosion protection to the inner layer 81. X-rays 86 can penetrate the window and enter the enclosure 83. The x-rays can impinge on an x-ray detector 84.

The enclosure 83 can be made of various materials, but titanium may be preferable due to a good match of the stack of thin film layers' 80 coefficient of thermal expansion and titanium's coefficient of thermal expansion. The titanium can be substantially pure titanium, with minimal other elements, in one embodiment. Alternatively, the titanium can include a certain percent of other elements. For example, the titanium can have a mass percent of greater than 99% in one embodiment, greater than 90% in another embodiment, or less than or equal to 90% in another embodiment. The stack of thin film layers 80 may be attached to the enclosure 83 by an adhesive, such as an epoxy for example.

The inner layer 81 can include aluminum layer(s) 21, polymer layer(s) 22, and/or corrosion-barrier layer(s) 23. For example, the inner layer 81 can be a polymer layer 22 disposed between two aluminum layers 21*a-b*, as shown in FIG. 2. The inner layer 81 can be a polymer layer 22 disposed between two aluminum layers 21*a-b*, and a second corrosion-barrier layer 23*b* disposed as the innermost layer, as shown in FIG. 3. The inner layer 81 can be a second corrosion-barrier layer 23*b* disposed between two aluminum layers 21*a-b*, and a polymer layer 22 disposed as the innermost layer, as shown in FIG. 4. The inner layer 81 can be a polymer layer 22 and an aluminum layer 21, as shown in FIG. 6. The outer layer 82 can be a first corrosion-barrier layer 23*b* and the inner layer 81 can be an aluminum layer 21 and a second corrosion-barrier layer 23*b*, with the aluminum layer disposed between the two corrosion-barrier layers 23*ab*, as shown in FIG. 7. Selection of the innermost layer can depend on the effect of this innermost layer on the vacuum, such as which layer outgases the least, and on which layer can best be sealed to the device.

Figure 9:
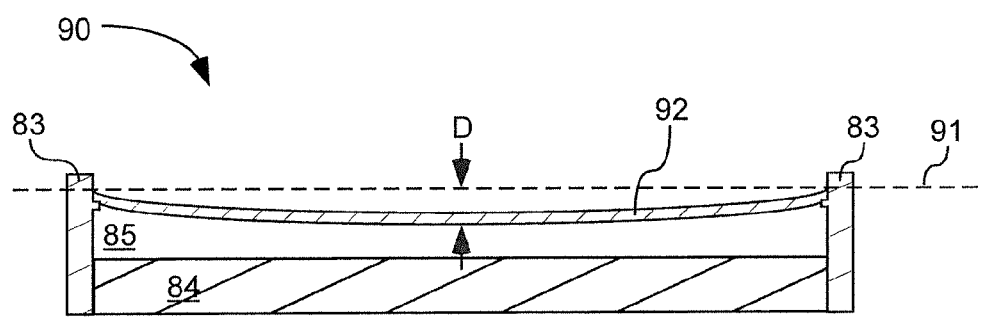
FIG. 9 is a schematic cross-sectional side view of an x-ray detection system showing deflection of an x-ray window.

Shown in FIG. 9 is an x-ray detection system 90 including an x-ray window 92 sealed to an enclosure 83. X-ray detector 84 can be sealed within the enclosure 83. Due to a differential pressure across the thin x-ray window 92 (typically atmospheric pressure outside and a vacuum within the hollow center 85), the x-ray window can bow or deflect by a deflection distance D. In order to expose the x-ray detector 84 to x-rays coming from multiple angles, it can be important to dispose the x-ray detector 84 close to the x-ray window 92, but the x-ray window 92 can short-out or otherwise interfere with the x-ray detector 84 if these two devices touch. Thus, it can be important to minimize the deflection distance D.

X-ray window embodiments (or stack of thin film layers in these x-ray window embodiments) described herein can be made sufficiently strong, and still have other desired characteristics described herein, such that these x-ray windows can have a relatively small deflection distance D. For example, the x-ray windows/stack of thin film layers described herein can have a deflection distance D of less than 400 micrometers in one aspect, less than 300 micrometers in another aspect, less than 200 micrometers in another aspect, or less than 100 micrometers in another aspect, with one atmosphere differential pressure across the stack of thin film layers.

Note that the deflection distance D is shown exaggerated in order to more clearly show this deflection. The deflection distance D is the distance the x-ray window 92 deflects due to a pressure differential across the window.

It can be important for x-ray windows to have a high transmissivity of x-rays to minimize x-ray data collection time and to allow transmission of low-energy x-rays. X-ray window embodiments (or stack of thin film layers in these x-ray window embodiments) described herein can have a high transmissivity of x-rays. For example, the x-ray windows/stack of thin film layers can have a transmissivity of greater than 50% in one aspect, a transmissivity of greater than 60% in another aspect, a transmissivity of greater than 70% in another aspect, a transmissivity of greater than 74% in another aspect, or a transmissivity of greater than 80% in another aspect, for x-rays having an energy of 1.74 keV.

It can be important for x-ray windows to block visible and infrared light transmission, in order to avoid creating undesirable noise in sensitive instruments, such as for example the x-ray detector 84 shown in FIGS. 8-9. For example, the x-ray windows, or stack of thin film layers, described herein can have a transmissivity of less than 10% in one aspect, less than 3% in another aspect, or less than 2% in another aspect, for visible light at a wavelength of 550 nanometers. For example regarding infrared light, the x-ray windows, or stack of thin film layers, described herein can have a transmissivity of less than 10% in one aspect, less than 4% in another aspect, or less than 3% in another aspect, for infrared light at a wavelength of 800 nanometers.

How to Make:

The aluminum layer 21 can be evaporation or sputter deposited. Amorphous carbon can be sputter deposited. HMDS can be spin cast or vapor deposited. For vapor deposition, a vacuum can be used but isn't required. Evaporation might be selected due to lower cost. Sputter might be selected due to improved ability to control film structure and adhesion. The aluminum layer 21 and/or corrosion-barrier layer 23 can be deposited on a sheet of polymer or other substrate.

Amorphous carbon has been successfully deposited by magnetron reactive gas sputtering with the following parameters and process:

DC Power: 400 watts
Target: graphite (99.999% purity)
Pump chamber pressure down to 2.3E-5 torr
Flow Ar gas to 7 mTorr
Turn DC Power up from 50 W to 400 W for 2 minutes
Flow ethylene at Ar:ethylene 9:1 ratio and dwell for 1 minute
Open shutter for deposition. Keep the substrate plate at about 30° C. with rotation.
Close shutter and ramp down power for 2 minutes
Vent the chamber The various amorphous carbon and aluminum window films described herein can be attached to a support structure, such as a silicon or a carbon composite support structure. The support structure can provide additional support and can allow the window film to be made thinner and/or span larger distances. The window films can be attached to support structures, such as a carbon composite support structure for example, by a suitable adhesive, such as an epoxy, cyanoacrylate, or polyurethane.

What is claimed is:

1. An x-ray window comprising:
    a. a stack of thin film layers including a first aluminum layer, a second aluminum layer, a polyimide layer, and a corrosion-barrier layer;
    b. the corrosion-barrier layer comprises a material selected from the list consisting of amorphous carbon and hexamethyldisilazane;
    c. an order of the stack of thin film layers is the corrosion-barrier layer, the first aluminum layer, the polyimide layer, then the second aluminum layer;
    d. an enclosure having a hollow center and an opening;
    e. the stack of thin film layers is hermetically sealed to the opening of the enclosure;
    f. the corrosion-barrier layer is disposed as the farthest layer away from the hollow center;
    g. the stack of thin film layers having:
        i. a transmissivity of greater than 60% for x-rays having an energy of 1.74 keV;
        ii. a transmissivity of less than 10% for visible light at a wavelength of 550 nanometers; and
        iii. a transmissivity of less than 10% for infrared light at a wavelength of 800 nanometers.

2. The x-ray window of claim 1, wherein the stack of thin film layers have a deflection distance of less than 300 micrometers with one atmosphere differential pressure across the stack of thin film layers.

3. The x-ray window of claim 1, wherein the stack of thin film layers have:
    a. a deflection distance of less than 200 micrometers with one atmosphere differential pressure across the stack of thin film layers;
    b. a transmissivity of greater than 70% for an x-ray energy of 1.74 keV;
    c. a transmissivity of less than 3% for visible light at a wavelength of 550 nanometers; and
    d. a transmissivity of less than 4% for infrared light at a wavelength of 800 nanometers.

4. The x-ray window of claim 1, wherein the enclosure comprises titanium.

5. The x-ray window of claim 1, wherein:
    a. the polyimide layer has a thickness of between 150 to 400 nanometers;
    b. the first aluminum layer has a thickness of between 10 to 30 nanometers;
    c. the second aluminum layer has a thickness of between 10 to 30 nanometers; and
    d. the corrosion-barrier layer has a thickness of between 5 to 25 nanometers.

6. An x-ray window comprising:
    a. a stack of thin film layers including an aluminum layer, a polymer layer, and a corrosion-barrier layer;
    b. the corrosion-barrier layer comprises a material selected from the list consisting of amorphous carbon and hexamethyldisilazane;
    c. the stack of thin film layers having:
        i. a transmissivity of greater than 60% for x-rays having an energy of 1.74 keV;
        ii. a transmissivity of less than 10% for visible light at a wavelength of 550 nanometers; and
        iii. a transmissivity of less than 10% for infrared light at a wavelength of 800 nanometers.

7. The x-ray window of claim 6, wherein the stack of thin film layers have a deflection distance of less than 300 micrometers with one atmosphere differential pressure across the stack of thin film layers.

8. The x-ray window of claim 6, wherein the stack of thin film layers have:
    a. a deflection distance of less than 200 micrometers with one atmosphere differential pressure across the stack of thin film layers;
    b. a transmissivity of greater than 70% for an x-ray energy of 1.74 keV;
    c. a transmissivity of less than 3% for visible light at a wavelength of 550 nanometers; and
    d. a transmissivity of less than 4% for infrared light at a wavelength of 800 nanometers.

9. The x-ray window of claim 6, wherein the corrosion-barrier layer comprises amorphous carbon with hybridization of carbon that is:
 a. less than 25% sp3 hybridization; and
 b. greater than 75% sp2 hybridization.

10. The x-ray window of claim 6, wherein the corrosion-barrier layer comprises hydrogenated amorphous carbon with an atomic percent of hydrogen between 1% and 10%.

11. The x-ray window of claim 6, wherein the polymer is a polyimide.

12. The x-ray window of claim 6, wherein:
 a. a mass percent of aluminum in the aluminum layer is at least 95%;
 b. a mass percent of polymer in the polymer layer is at least 95%;
 c. a mass percent of carbon and hydrogen in the corrosion-barrier layer is at least 95%.

13. The x-ray window of claim 6, wherein an order of the layers in the stack of thin film layers is the polymer layer, the aluminum layer, then the corrosion-barrier layer.

14. The x-ray window of claim 6, wherein:
 a. the polymer layer has a thickness of between 150 to 400 nanometers;
 b. the corrosion-barrier layer has a thickness of between 5 to 25 nanometers; and
 c. the aluminum layer has a thickness of between 10 to 30 nanometers.

15. The x-ray window of claim 6, further comprising an enclosure having a hollow center and an opening, the enclosure comprising titanium, and wherein the stack of thin film layers is hermetically sealed to the opening of the enclosure.

16. The x-ray window of claim 15, wherein the corrosion-barrier layer is the farthest layer away from the hollow center.

17. The x-ray window of claim 15, wherein:
 a. the aluminum layer comprises a first aluminum layer and a second aluminum layer; and
 b. an order of the stack of thin film layers is the first aluminum layer, the polymer layer, the second aluminum layer, then the corrosion-barrier layer.

18. An x-ray window comprising:
 a. a stack of thin film layers including an aluminum layer disposed between a first corrosion-barrier layer and a second corrosion-barrier layer;
 b. the first corrosion-barrier layer and the second corrosion-barrier layer comprise a material selected from the list consisting of amorphous carbon and hexamethyldisilazane;
 c. the stack of thin film layers having:
  i. a transmissivity of greater than 60% for an x-ray energy of 1.74 keV;
  ii. a transmissivity of less than 10% for visible light at a wavelength of 550 nanometers; and
  iii. a transmissivity of less than 10% for infrared light at a wavelength of 800 nanometers.

19. The x-ray window of claim 18, wherein the stack of thin film layers have:
 a. a deflection distance of less than 200 micrometers with one atmosphere differential pressure across the stack of thin film layers;
 b. a transmissivity of greater than 70% for an x-ray energy of 1.74 key;
 c. a transmissivity of less than 3% for visible light at a wavelength of 550 nanometers; and
 d. a transmissivity of less than 4% for infrared light at a wavelength of 800 nanometers.

20. The x-ray window of claim 18, wherein:
 a. the first corrosion-barrier layer has a thickness of between 1 to 25 nanometers;
 b. the aluminum layer has a thickness of between 10 to 60 nanometers; and
 c. the second corrosion-barrier layer has a thickness of between 1 to 25 nanometers.

\* \* \* \* \*